United States Patent [19]
Goldstein

[11] Patent Number: 5,500,054
[45] Date of Patent: Mar. 19, 1996

[54] SUPEREMISSIVE LIGHT PIPES AND PHOTOVOLTAIC SYSTEMS INCLUDING SAME

[75] Inventor: Mark K. Goldstein, Del Mar, Calif.

[73] Assignee: Quantum Group, Inc., San Diego, Calif.

[21] Appl. No.: 370,962

[22] Filed: Jan. 10, 1995

[51] Int. Cl.$^6$ ............................................. H01L 31/052
[52] U.S. Cl. ...................... 136/253; 136/246; 136/247; 136/259; 250/227.11; 250/484.3; 250/493.1; 250/496.1; 385/123; 385/142; 385/147
[58] Field of Search .................................. 136/246–247, 136/253, 257, 259; 250/227.11, 484.3, 493.1, 496.1; 385/123, 142, 147

[56] References Cited

U.S. PATENT DOCUMENTS

| | | | |
|---|---|---|---|
| 3,751,303 | 8/1973 | Kittl | 136/253 |
| 4,090,359 | 5/1978 | Doellner | 60/722 |
| 4,313,425 | 2/1982 | Crackel et al. | 126/678 |
| 4,316,048 | 2/1982 | Woodall | 136/253 |
| 4,425,907 | 1/1984 | Younghouse | 126/685 |
| 4,467,208 | 8/1984 | Müller et al. | 250/483.1 |
| 4,776,895 | 10/1988 | Goldstein | 136/253 |
| 5,356,487 | 10/1994 | Goldstein et al. | 136/253 |

FOREIGN PATENT DOCUMENTS 2525630  12/1976  Germany ............... 136/247

Primary Examiner—Aaron Weisstuch
Attorney, Agent, or Firm—Christie, Parker & Hale

[57] ABSTRACT

A superemissive light pipe includes a photon transmitting optically transparent host having a body and oppositely arranged end portions. In one embodiment, superemissive material is disposed within the host and an optical cladding is disposed onto an outside surface portion of the host. The superemissive material emits photons upon thermal stimulation. The optical cladding reflects photons emitted by the superemissive material toward the host and directs the photons to the end portions. The optical cladding has an index of refraction different from that of the host. In another embodiment, a layer of superemissive material is interposed between the surface of the host and the optical cladding. A thermal energy source is either disposed internally within the host, in the form of radioisotopic particles that undergo nuclear decay, or externally outside of the light pipe, in the form of a general purpose heating source, to effect photon emission by the superemissive material. One or more photovoltaic cells are positioned adjacent the end portions of the light pipe to convert photon radiation to electricity. An optical filter can be inserted before the cell to limit the radiation received to a selected wavelength. An optical reflector can be positioned at one end of the light pipe to direct all photon emission from a single light pipe end.

29 Claims, 3 Drawing Sheets

SUPEREMISSIVE LIGHT PIPES AND PHOTOVOLTAIC SYSTEMS INCLUDING SAME

FIELD OF THE INVENTION

The present invention relates to a means for efficiently producing, collecting and directing photons from photon emitters that are incorporated within a light pipe system, which are capable of producing selected and/or broad band outputs for a variety of applications such as lighting, cooking, pumping lasers, heating fluids and solids, promoting photochemical reactions, photolithography and for producing electricity when selected photons are directed to one or more photovoltaic cells.

BACKGROUND OF THE INVENTION

A superemissive material can generally be described as a material that, when heated to a threshold temperature, includes one or more electrons that jump to a different electron energy level in quantum increments which causes the emission of visible or infrared radiation in a wavelength band related to the electron's inner electron shell vacancy. Emitted radiation produced as a result of such electron transition is often within a narrow band and can, therefore, be absorbed efficiently by a photovoltaic device, such as silicon cell, indium-gallium-arsenic cell, or the like to produce an output voltage and current. A superemission formed from such thermally-stimulated superemissive material produces radiation in relatively concentrated narrow spectral bands compared to blackbody or greybody emitters which typically exhibit a broadband thermal emission. As a result of the concentrated, narrow spectral band, photons emitted from the superemitter and focused to the photovoltaic power system have greater efficiency than that generated by a blackbody emitter operating at the same heat flux. However, a blackbody emitter may be constructed to emit visible or infrared radiation in a narrow spectral band by using a band-pass filter interposed between the superemitter and the photovoltaic device. Filtering, however, is not energy efficient.

Photon generators that use superemitters to emit radiation and, therefore, generate photons are well-known and are disclosed in U.S. Pat. Nos. 4,776,895, 4,793,799 and 4,906,178 and are also disclosed in U.S. patent application Ser. No. 08/085,117. For example, such a photon generator includes a porous ceramic burner in the shape of a cylinder having an annular passage extending therethrough. A superemitting fiber layer is disposed along the inside wall of the ceramic burner and is made from a high temperature fiber or coating comprising, for example, pure or doped oxides of uranium, thorium, ytterbium, aluminum, gallium, yttrium, erbium, holmium, zirconium, chromium or other high temperature oxides. When subjected to thermal energy, the fiber layer emits radiation that is directed to a central axis running along the annular passage of the cylindrical burner.

As the ceramic burner is heated, the superemissive fiber layer emits radiation that can be filtered, by use of a cylindrical hollow filter disposed within the ceramic burner, to emit radiation at a selected bandwidth. The radiation passing through the filter is directed to the surface of an optical cable that is disposed centrally within the annular passage of the ceramic burner and filter. The photons generated by the fiber layer are, therefore, directed onto the optical cable and are channeled through the cable to each cable end, which is directed to a target comprising a photovoltaic cell. Accordingly, the photons generated by the superemissive fiber layer within the ceramic burner are directed through the optical cable into the photovoltaic cell, and converted to electricity.

Other embodiments of the photon generator are disclosed in the above-identified U.S. patents and U.S. patent application, which are hereby incorporated by reference. However, each embodiment of the photon generator is similar in that each construction comprises the use of an outer body that is subjected to thermal energy and that includes a superemitter material disposed thereon to effect emission of radiation, i.e., the generation of photons onto a portion of an optical cable used to collect and channel the photons to a photovoltaic target.

The embodiments of the photon generator disclosed in the above-identified U.S. patents and U.S. patent application do not promote the efficient generation and collection of photons. In the above-discussed embodiments, the emission of photons is effected through application of thermal energy to the body, which passes through the body by thermal conduction to the superemissive material. Accordingly, a large amount of thermal energy is wasted through the mechanism of thermal conduction. Additionally, the photons emitted by the superemissive material are not collected efficiently, as relatively weaker photons, or photons that are emitted from a distance further away from the optical cable than other emitted photons, are not collected. Accordingly, all of the photons generated by the superemitter are not collected by the optical cable and, therefore, are not directed to the photovoltaic cell for conversion to electricity.

Additionally, the embodiment of the photon generator described above results in the target, i.e., photovoltaic cell, being subjected to thermal heating via conductive heat transfer from the thermally heated body to each end of the optic cable and to the photovoltaic cell. The thermal heating of the photovoltaic cell commonly leads to thermally related failure due to thermal stresses and thermal shock that develops within the cell.

It is, therefore, desirable that a device be constructed to facilitate the economic generation and collection of photons. It is desired that the device be simple to construct and be easily adaptable to use with a number of different thermal generation sources. It is desirable that the device be configured to accommodate use with one or more photovoltaic cells to effect conversion of photons to electricity. It is desirable that the device be constructed in such a manner as to eliminate or minimize the effects of thermal shock on the cell. It is also desirable that the device be capable of being manufactured from conventional materials using conventional manufacturing techniques.

SUMMARY OF THE INVENTION

There is, therefore, provided in the practice of this invention a superemissive light pipe for generating photons having an optically transparent host capable of transmitting photons therethrough. The host is configured having an elongated cylindrical body with end portions at each body end. In one embodiment of the light pipe, a superemissive material is disposed within the host. The superemissive material is formed from a rare earth material capable of emitting photons upon thermal stimulation. The superemissive material may be selected so that the photons are emitted at a particular temperature and are emitted within a predetermined wavelength. An optical cladding is disposed on the body of the host for reflecting photons emitted within the host away from the surface portion of the body so that all photons are directed toward the end portions of the body. The optical cladding comprises a material having an index of refraction different from an index of refraction of the host. In another embodiment of the light pipe, the superemissive material is disposed onto the surface of the host body, and an optical cladding is disposed onto a surface of the superemissive material.

A thermal energy source for raising the temperature of the light pipe, and thereby effecting photon emission, may either be disposed within the host material itself, i.e., be an internal thermal source, or may be disposed outside of the host material, i.e., be an external thermal source. In the case of the internal thermal source, a radioisotope in the form of radioisotopic particles are disposed within the host. Nuclear decay of such radioisotopic particles provides sufficient thermal energy to effect photon emission from the superemissive material. In the case of the external thermal source, the light pipe may be placed within a general purpose heat source such as a solar collector, nuclear reactor, combustion system and the like.

One or more photovoltaic cells are placed adjacent an end portion of the light pipe. The photovoltaic cell converts the photon radiation emitted from the end portion to electricity. An optical filter can be interposed between the end portions of the body and the photovoltaic cell to ensure that the radiation passing to the photovoltaic cell is within a specific wavelength. An optical reflector may be placed at one end portion of the body to ensure that all photons generated by the light pipe are emitted from a single end.

A light pipe constructed in this manner promotes efficient and economic generation of photons because thermal energy waste due to thermal conduction is eliminated, in the case of the internal thermal energy source, and minimized, in the case of the external energy source due to the relatively thin layer of optical cladding. The light pipe is easily adaptable to accommodate use with a number of different external thermal energy sources. The light pipe can be used to effect photon emission onto one or more photovoltaic cells to generate electricity. The light pipe is constructed in a manner that minimizes the transmission of thermal energy to the photovoltaic cell, as use of the photon transmitting host allows the thermal energy source to be located a good distance away from the end portions of the host adjacent the cell. Additionally, optical connectors and cables can be attached to the end portions of the light pipe to further extend the distance between the thermal energy source and the end portions, thereby further minimizing the effects of thermal conduction on the photovoltaic cell.

BRIEF DESCRIPTION OF THE DRAWING

These and other features and advantages of the present invention will become appreciated as the same becomes better understood with reference to the specification, claims and drawings wherein:

FIG. 1b is a cross-sectional front view of the second embodiment of the superemissive light pipe of FIG. 1a;

FIG. 3b is a cross-sectional front view of the fourth embodiment of the superemissive light pipe of FIG. 3a;

DETAILED DESCRIPTION

Figure 1:
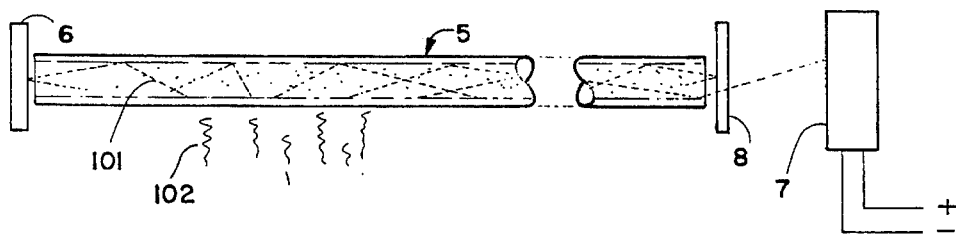
FIG. 1 is a cross-sectional side elevation of a first embodiment of a superemissive light pipe as constructed according to principles of this invention with a band pass filter and a photovoltaic cell.

FIG. 1 illustrates a superemissive light pipe 5 as constructed in accordance with principles of this invention. There are a number of different ways of producing a supersmissive light pipe. For example, one method may be by doping a crystal, ceramic or glass host during formation, such as in Ho and Er laser materials, with a supersmissive material.

Another method involves coating a wave guide (or light pipe) with a material containing a supersmissive dopant or dopants and then placing a second coating on top of this doped wave guide material. The second coating or optical cladding has an index of refraction significantly different from the host or doped host so that the system acts as a wave guide as discussed below. As long as the optical cladding has a significantly different index of refraction than the core, an optical wave guide for the photons emitted by the supersmissive dopant(s) can be fabricated.

Figure 2A:
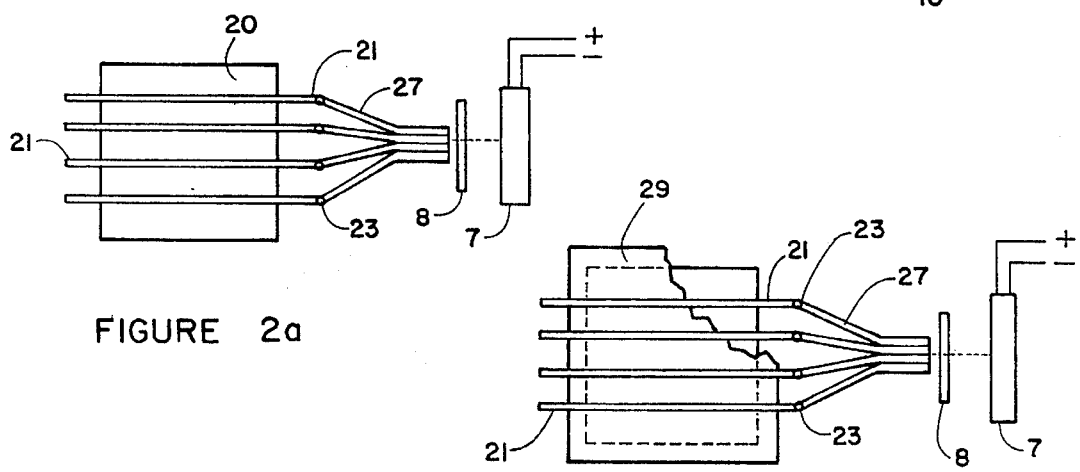
FIG. 2a is a side elevational view of a third embodiment of a superemissive light pipe system placed within a radioisotope thermal energy source, a band pass filter, and at least one photovoltaic cell.
Figure 2B:
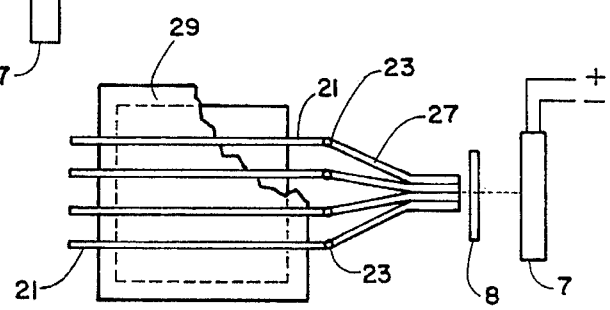
FIG. 2b is a side elevational view of the third embodiment of the superemissive light pipe placed around a general purpose thermal energy source, a band pass filter, and at least one photovoltaic cell.

The supersmissive light pipe 5 constructed by either method is heated by a thermal energy source 102 until a desired photon flux or power is obtained. The application of thermal energy to the light pipe causes the supersmissive dopant(s) to emit narrow bands of photons 101 proportional to the amount of thermal energy applied. The supersmissive light pipe illustrated in FIG. 1 is heated by an external thermal source 102. The thermally stimulated photons produced within the light pipe do not escape except at end portions of the pipe where at least one target 7, e.g., one or more photovoltaic (PV) cells and the like, may be placed. The end portions and adjacent target 7 may be placed a substantial distance from the thermal energy source 102 by means of fiber optic cables and connectors (as shown in FIGS. 2a and 2b), thereby reducing the need to cool the PV cells and reducing adverse thermally induced effects such as thermal shock and the like.

The superemissive light pipe illustrated in FIG. 1 includes a reflector 6 positioned at one end portion of the light pipe to direct the photons generated by the superemissive material and directed through the light pipe to an opposite end portion where a photovoltaic cell 7 is located. A band pass filter 8 is interposed between the end portion of the light pipe adjacent the target 7 and the target to ensure that only those photons within a predetermined bandwidth or wavelength are directed to the target.

A superemissive light pipe constructed according to principles of this invention can be produced in one of the following manners. A process of sol-gel porous monoliths and coatings can be used to form porous sections in the transparent crystal, ceramic or glass host that is used to form the light pipe or wave guide. Superemissive materials may be incorporated within these pores. Materials suitable for use as the superemitter includes a narrow or selected emitter such as neodymium, yttrium, ytterbium, holmium, erbium, thulium, cerium, thorium, or thorium-holmium, aluminum-ytterbium-yttrium mixed oxides, or mixtures thereof, and other materials that emit radiation by an inner electron shell transition.

The superemissive material may be selected to emit photons in a predetermined wavelength band or may be selected to emits photons at multiple bands of wavelengths. The use of certain materials increases the useful life, reduces corrosion, and changes the emissivity characteristics of the resultant light pipe to those desired for a number of different PV cell applications. The incorporation of such superemissive materials into the transparent host may be accomplished by a number of techniques such as imbibing a soluble salt of the superemissive material into the pores of the host and then chemically changing the salt to an insoluble form such as an oxide, or incorporating fine particles of the superemissive material in a fluid and soaking the host material in a slurry of this mix.

In addition, coatings of alkoxides of the superemissive material or other similar soluble precursors can be employed. Such superemissive alkoxides may be mixed with a transparent host alkoxide in almost any proportion prior to coating the host. Alternatively, the alkoxides can be applied in a more pure form or in a form that eventually produces a superemissive layer within or outside of the transparent light pipe.

After the superemissive material has been incorporated into or coated onto the host an optical cladding is deposited around an outside surface of the host to ensure that the photons emitted from the superemissive material remain in the light pipe until they reach an end portion. If desired, a reflector may be placed at one end of the light pipe to concentrate photon emissions at the other end. Material suitable for forming the optical cladding include optically transparent materials that are similar to those described for the host, but having an index of refraction significantly different than the host or doped wave guide material, and can also include thoria, yttrium, rhodium, metal and yttrium-alumina garnet. In a preferred embodiment, it is desired that the optical cladding have an index of refraction that is significantly different from that of the host to reflect the photons emitted by the superemissive material away from the cladding surface and back into the host. An optical cladding having an index of refraction that is not significantly different from the host reduces the effectiveness of the light pipe in collecting and directing photons to the targets positioned adjacent the end portions, as photons generated by the superemissive material are allowed to escape through the sidewalls of the light pipe.

The optical cladding may be added by means of a sol-gel process as described above. The optical cladding may have a thickness in the range of from 0.1 to 100 micrometers.

Figure 1A:
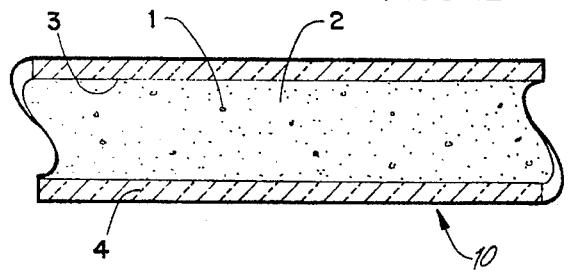
FIG. 1a is a cross-sectional side elevation of a second embodiment of a superemissive light pipe comprising an internal thermal energy source.
Figure 1B:
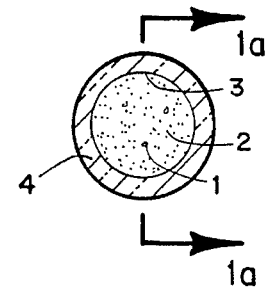

Unlike the superemissive light pipe illustrated in FIG. 1, FIGS. 1a and 1b illustrate a section of a second embodiment of a superemissive light pipe 10 that is self heated by action of nuclear decay. The second embodiment of the superemissive light pipe is constructed by incorporating particles of at least one radioactive isotope 1 of a rare earth element and a superemitter material 2 into a transparent host 3. In a preferred second embodiment, the radioactive isotope is plutonium 238 in the form of plutonium 238 oxide, the superemissive material is holmium, and the transparent host is sapphire. Alternatively, it is to be understood that the transparent host may constructed from glass, ceramic, or from an optically transparent isotope such as an actinide oxide, and the superemissive material may be selected from the same group of materials previously described above.

Figure 1C:
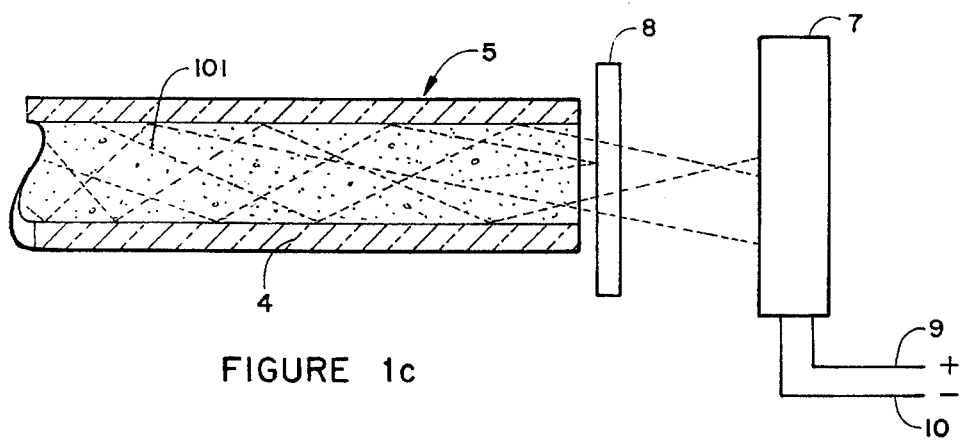
FIG. 1c is a cross-sectional side elevation of the second embodiment of a superemissive light pipe of FIGS. 1a and 1b, a band pass filter, and at least one photovoltaic cell.

As shown in FIGS. 1a–1c, the light pipe 10 also includes an optical cladding 4 capable of reflecting photons 101 generated by the superemissive material 2 such that the photons are directed through the light pipe to one or more targets 7 positioned at one or more end portions of the pipe. Wires 9 and 10 extend from the target 7, a photovoltaic cell, to facilitate the transmission of electrical current to a desired electrical device to be powered. A reflector (not shown) may be used at one end of the light pipe to direct the emission of photons to the target positioned at an opposite end. If desired, a band pass filter 8 can be interposed between the light pipe end and the target 7 to further narrow the wavelength of radiation that is passed to the target. As the radioactive isotope 1 undergoes nuclear decay, such decay releases thermal energy to the surrounding host and superemissive material, raising the temperature of the superemissive material to cause thermal fluorescence.

FIG. 2a illustrates a third embodiment of a superemissive light pipe constructed according to principles of this invention. The third embodiment comprises a number of individual light pipes 21 that are constructed in a manner similar to that previously described above and illustrated in FIG. 1, i.e., a light pipe that requires an external thermal energy source for photon generation. The superemissive light pipes 21 are each formed from a transparent host material that has one or more superemissive materials incorporated therein. In a preferred third embodiment, the host may be formed from yttrium-alumina-garnet (YAG), alumina, sapphire and the like, and the superemissive material may include oxides of neodymium, holmium, and mixtures thereof. The light pipes 21 each comprise an optical cladding selected from the suitable materials previously described above having an index of refraction significantly different from that of the host.

The superemissive light pipes 21 are disposed within a radioisotope source 20 such as a nuclear reactor and the like, so that nuclear decay of the radioisotope source causes thermal energy to be transmitted to the outside surface of the light pipes, which in turn raises the temperature within the light pipes to cause the superemitter to emit photons. The end portions of each light pipe 21 are connected to respective fiber optic cables 27 via optical collectors 23. The optical collectors 23 serve to collect and redirect the photons emitted through the end portions of each light pipe to the fiber optic cables 27. End portions of the fiber optic cables 27 are positioned adjacent to and are directed toward a target 7, e.g., one or more PV cells, to reflect conversion of the photon radiation to electricity. A band pass filter 8 is interposed between the fiber optic cables 27 and the PV cells 7 to ensure that the radiation directed to the PV cells is within a predetermined narrow wavelength.

Additionally, use of the fiber optic cable 27 serves as a means to reduce the size and weight of a radiator (not shown) that can be used to cool the PV cells 7. The band pass filter 8 also acts to decrease the temperature of the PV cells, thereby, increasing efficiency and reducing radiator size by reflecting photons of wavelengths outside the target band of the PV cells.

FIG. 2b illustrates the third embodiment of the superemissive light pipe comprising a number of light pipes 21, as described above and illustrated in FIG. 2a, that are placed around a general purpose heat source 29. The general purpose heat source 29 can include a solar collector and the like. The third embodiment also includes optical collectors 23 and optical cables 27 that are used to collect and redirect photons emitted from end portions of each light pipe 21 to a target 7. A band pass filter 8 is interposed between the optical fibers 27 and target 7 to limit photons passed to the target within a narrow wavelength.

Figure 3A:
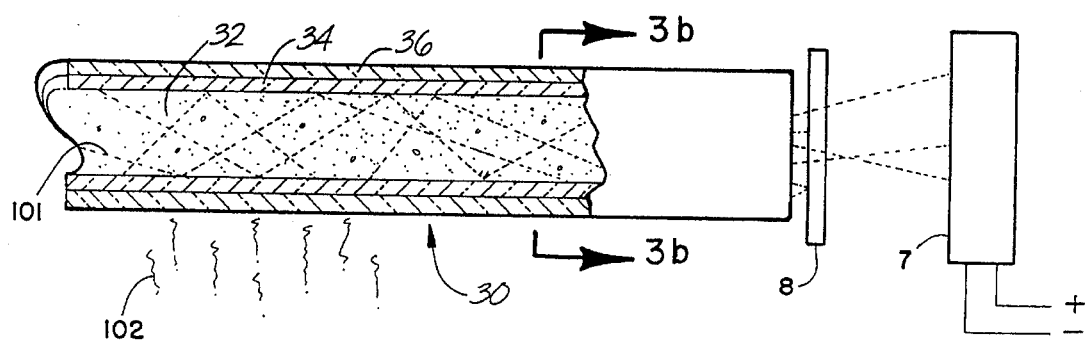
FIG. 3a is a cross-sectional elevation of a fourth embodiment of a superemissive light pipe, a band pass filter, and at least one photovoltaic cell.
Figure 3B:
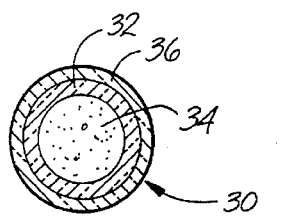

FIGS. 3a and 3b illustrate a fourth embodiment of a superemissive light pipe constructed according to principles of this invention. The light pipe 30 is constructed by applying a thin layer of superemissive material 32 to the surface of a host 34 before a layer of optical cladding 36 is applied. Accordingly, unlike the previously described and illustrated light pipe embodiments, the fourth light pipe embodiment includes superemissive materials that are coated onto the surface of the host, rather than being incorporated into the host itself. In a preferred fourth embodiment, the host is formed from sapphire. In a preferred fourth embodiment, for a particular application, the superemissive coating has a thickness in the range of from 0.1 to 10,000 micrometers. A superemissive coating having a thickness of less than about 0.1 millimeter may produce a lower amount of photon flux than desired for a particular application. A superemissive coating having a thickness of greater than about 10,000 millimeters may produce a higher amount of photon flux than desired for a particular application. Accordingly, it is to be understood that the thickness of the superemissive coating will vary as a function of the particular light pipe application. Additionally, the thickness of the superemissive coating will vary as a function of the particular superemissive material selected and the amount of superemissive dopant contained in the coating, i.e., as a function of the superemissive dopant density.

The thin layer of superemitter material is fixed to the surface of the fiber core by a fixing process, which is dependent on the type of superemitter coating applied. For example, for a nitrate solution the fixing process involves reducing the nitrates to hydroxide and then heating the hydroxide to form a desired oxide, for an alkoxide the fixing process involves curing, drying, and firing as described in detail by J. C. Brinker and G. W. Scherer; Sol-Gel Science, The Physics and Chemistry of Sol-Gel Processing, San Diego, Academic Press, 1990. The layer of superemissive material can be applied by one of several conventional coating techniques such as by spray coating, chemical-vapor deposition (CVD), sputtering, dip coating, sol-gel process and the like. A preferred application technique is by sol-gel process. A preferred superemissive material is doped alumina or YAG.

After the superemitter layer 32 is fixed to the surface of the transparent host 34, the cladding layer 36 is applied to the surface of the superemissive material 32. It is desired that the optical cladding have an index of refraction sufficiently different from the superemissive core system or different from the area outside the cladding to retain emitted photons within the light pipe. In a preferred fourth embodiment, the optical cladding has a thickness in the range of from 0.1 to 100 micrometers. The desired range of optical cladding thickness represents a compromise between obtaining a desired degree of photon reflectivity, optimizing material costs, and providing a desired degree of thermal protection to the light pipe.

The superemissive light pipe 30 is subjected to an external thermal source 102 that causes the temperature of the superemissive coating 34 to rise and emit photons 101. The photons 101 emitted by the superemissive layer 34 are reflected by the optical cladding 36 and are directed toward and into the transparent host 32, where the photons 101 are collected and directed to end portions of the pipe. At least one target 7, e.g., at least one PV cell, is positioned adjacent the end portion of the light pipe 30. A band pass filter 8 is interposed between the end portion of the light pipe and the target 7 to ensure that the radiation directed to the target is within a predetermined wavelength.

Figure 4B:
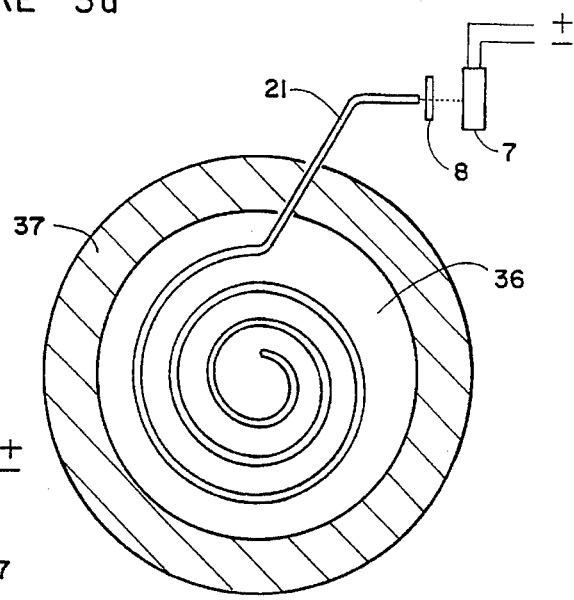
FIG. 4b is a cross-sectional top elevation of the fifth embodiment of the superemissive pipe (comprising a single spirally wound light pipe) placed within the air-gas combustion system of FIG. 4a, a band pass filter, and at least one photovoltaic cell.
Figure 4A:
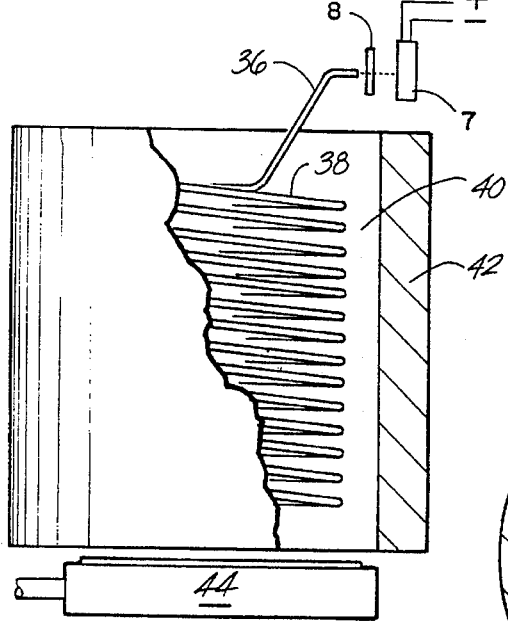
FIG. 4a is a partially cut-away side elevation of a fifth embodiment of a superemissive light pipe placed within an air-gas combustion system, a band pass filter, and at least one photovoltaic cell.

FIGS. 4a and 4b illustrate a fifth embodiment of a superemissive light pipe disposed within a fuel combustion system. The light pipe 38 can be constructed either comprising superemissive material within the host, as disclosed for the light pipe embodiments in FIGS. 1, 2a and 2b, or comprising superemissive material as a coating on the host as that previously described for the fourth embodiment of the light pipe illustrated in FIGS. 3a and 3b. The light pipe 38 is formed in a spirally wound configuration and is placed within a combustion chamber 40 of an air-gas fuel combustion system 42. A burner system 44 supplies combustion energy to the combustion chamber 40, raising the temperature of the light pipe 38 to effect the emission of photons from the superemissive material. In a preferred fifth embodiment, the light pipes comprise superemissive material that is coated onto the outside surface of the host.

Because of the extreme temperatures generated by such a fuel combustion system, it may be desirable to form the optical cladding from a thin layer of thoria or doped thoria. An optical cladding formed from thorium oxide enables the light pipe to be subjected to extreme combustion temperatures. If desired, operation of the light pipe under conditions of even higher combustion temperatures are possible by forming the superemissive layer from a thoria based or thoria doped material. Forming both the optical cladding and superemissive coating from a thoria-based material would be difficult and expensive but would enable operation of the light pipe at high temperatures and, thereby provide operation at high power levels and high efficiencies when the appropriate rare earth or other superemissive materials are used.

A target 7, e.g., one or more PV cells, is positioned adjacent an end portion 36 of the light pipe 38, and a band pass filter is interposed between the light pipe 38 and the PV cell 7 to ensure that the radiation passing to the PV cell is within a predetermined wavelength.

Figure 4C:
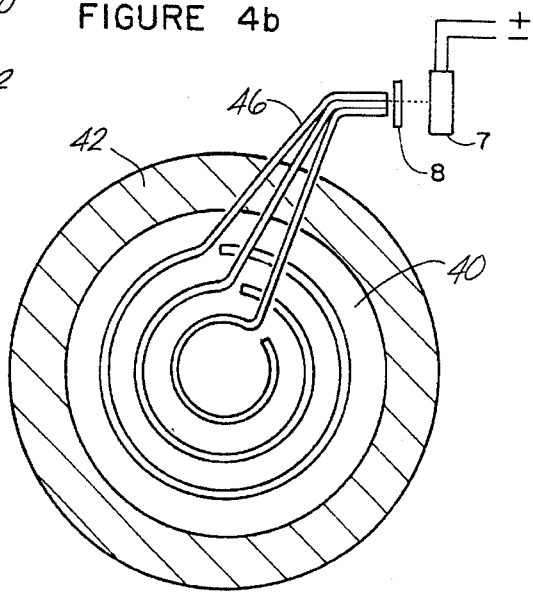
FIG. 4c is a cross-sectional top elevation of a sixth embodiment of a superemissive light pipe system (comprising a number of independent spirally wound light pipes) placed in an air-gas combustion system with a band pass filter, and at least one photovoltaic cell.

FIG. 4c illustrates a sixth embodiment of a superemissive light pipe disposed within a fuel combustion system. The sixth embodiment comprises a number of light pipes 46 that are each formed in a spirally wound configuration. Each light pipe is constructed in the same manner as that previously described above and illustrated in FIGS. 4a and 4b. In a preferred sixth embodiment, the light pipes comprise superemissive material that is coated onto the outside surface of the host. In a preferred sixth embodiment, three light pipes are disposed within the combustion chamber 40 of the fuel combustion system 42. Each light pipe 46 is formed in a spirally wound configuration having a different diameter, so that light pipes can be nested concentrically together. End portions of the light pipes 46 are collected together and direct toward at least one PV cell 7 positioned adjacent the light pipes. A band pass filter 8 is interposed between the end portions of the light pipes and the PV cell to ensure that radiation directed to the PV cell from each light pipe end is within a predetermined wavelength. Alternatively, the superemissive light pipes 46 may be woven into an advanced emissive matrix as described in U.S. patent application Ser. No. 08/237,306 filed on May 3, 1994, the subject matter of which is hereby incorporated by reference.

Figure 5A:
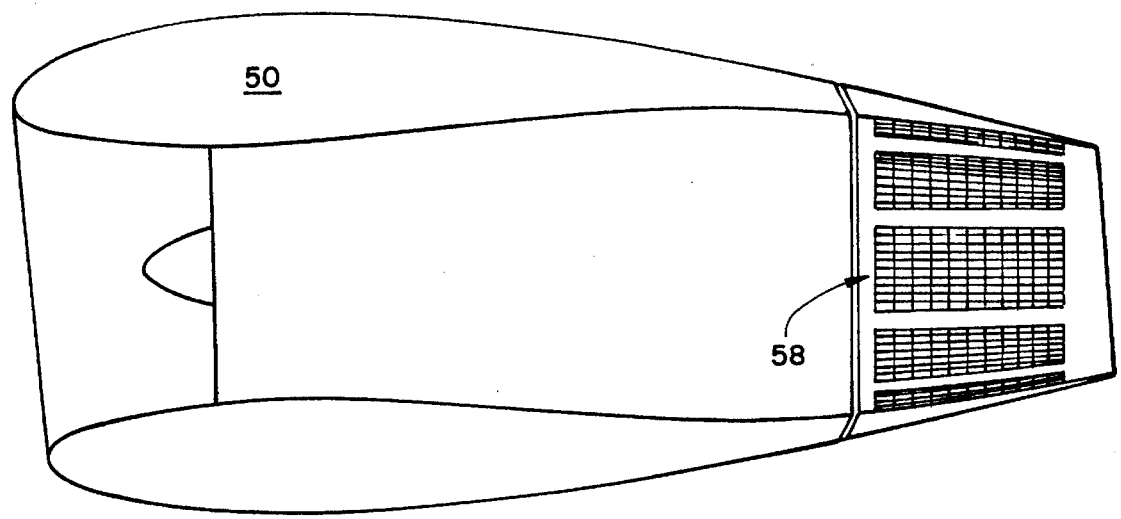
FIG. 5a is a side elevation of a seventh embodiment of a superemissive light pipe system used in conjunction with thermal energy source in the form of a jet engine.
Figure 5B:
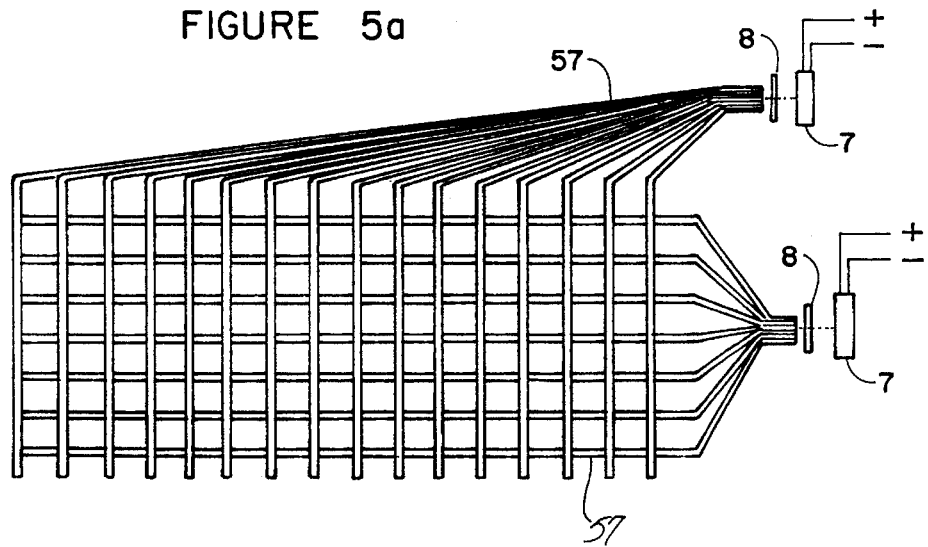
FIG. 5b is a side elevation of the seventh embodiment of the superemissive light system of FIG. 5a, without external engine shrouding, comprising two superemissive light pipe systems, a band pass filter, and at least one photovoltaic cell for each system.

FIGS. 5a, 5b illustrate a seventh embodiment of a superemissive light pipe positioned adjacent a jet engine.

The seventh embodiment of a light pipe 57 is disposed adjacent an exhaust stream of a jet engine 50, which serves as the external thermal energy source. The seventh embodiment includes a number of light pipes 57 that can be arranged to form a matrix. In a preferred seventh embodiment, the light pipes 57 are configured in two light pipe systems, wherein each system includes a number of similarly oriented light pipes that intersect with light pipes of the other system. The light pipes of each system can be configured in the same manner as that previously described and illustrated in FIGS. 1, 2a, and 2b, i.e., comprising superemissive material incorporated within the transparent host, or in the same manner as that previously described and illustrated in FIGS. 3a, 3b, 4a, 4b, and 4c, i.e., comprising superemissive material coated onto the transparent host. In a preferred seventh embodiment, the light pipes comprise superemissive material that is coated onto the outside surface of a transparent host.

The end portions of the light pipes 57 of each system are collected together and are directed toward a target 7,. e.g., at least one PV cell, positioned adjacent the end portions of each light pipe system. As the jet engine is operated the exhaust stream created by such operation provides thermal energy that raises the temperature of the light pipes, thereby causing the superemissive material to emit photons. The photons are collected and channeled through the light pipes to the end portion of each light pipe where the photons are emitted to the PV cell. A band pass filter 8 is interposed between the end portions of each light pipe system and each respective target 7 to ensure that the radiation passing to each target is within a predetermined wavelength. The PV cells may be cooled by outside air passing through vents 58 or by air from the jet engine compressor system.

It is to be understood that there are a number of design factors that can affect any combustion driven superemissive light pipe photon generator, such as surface area, optical transmission loss within the host or optical fiber, and reflection efficiency of the optically selective reflector design which can be placed on an end portion of the light pipe to keep the heat in and let selected photons out. It is important that the optical cladding have a low emissivity compared to the emissive layer. It is also important that the transparent host material forming the superemissive light pipe yield a low level of off-band radiation, thereby promoting the efficiency of the light pipe in the production of electricity. This off-band radiation can be filtered out in a cost effective manner by use of band pass type filter system attached to the end of the light pipe, optical fiber(s) or by the optical fiber system itself.

Additionally, in a combustion driven superemissive light pipe photon generator it may be feasible to apply thoria to sapphire or YAG based optical fiber systems for the reasons previously discussed. The ability to produce a thermal shock resistant product and one that is stable to thermal expansion is desirable for long term operation. The thinner the diameter of the optical fiber used to make the superemissive light pipe the more photons per BTU are likely to be produced, due to enhanced heat transfer between the combustion gases and the emitter system.

Although limited embodiments of the superemissive light pipe has been described herein, many modifications and variations will be apparent to those skilled in the art. Accordingly, it is to be understood that, within the scope of the appended claims, the superemissive light pipe constructed according to principles of invention may be embodied other than as specifically described herein.

What is claimed is:

1. A superemissive light pipe comprising: an elongated photon transmitting host; means for reflecting photons from surface portions of the host and directing such photons toward end portions of the host;

a superemissive material for emitting photons, wherein the superemissive material is disposed interiorly of the means for reflecting photons; and means for thermally energizing the superemissive material to effect emission of photons.

2. The superemissive light pipe as recited in claim 1 wherein the superemissive material is disposed within the host.

3. The superemissive light pipe as recited in claim 1 wherein the superemissive material is disposed onto a outside surface of host and is interposed between the host and the reflecting means.

4. The superemissive light pipe as recited in claim 1 wherein the photon transmitting host comprises a transparent material, and wherein the host is configured in the shape of a cylinder having two oppositely arranged end portions.

5. The superemissive light pipe as recited in claim 1 wherein the superemissive material emits photons in a predetermined wavelength band.

6. The superemissive light pipe as recited in claim 1 wherein the superemissive material emits photons at multiple bands of wavelengths.

7. The superemissive light pipe as recited in claim 1 wherein at least one end portion of the host is directed toward at least one photovoltaic cell positioned adjacent the end portion.

8. The superemissive light pipe as recited in claim 7 comprising an optical filter interposed between the end portion of the host and the photovoltaic cell for maintaining photons that are directed to the photovoltaic cell within a predetermined wavelength.

9. The superemissive light pipe as recited in claim 1 wherein the means for thermally energizing the superemissive material comprises a thermal energy source positioned externally outside of the host.

10. The superemissive light pipe as recited in claim 9 wherein the external thermal energy source is selected from the group consisting of a fuel combustion system, a nuclear reactor, a solar collector, and the exhaust of a jet engine.

11. The superemissive light pipe as recited in claim 1 wherein the means for thermally energizing the superemissive material is a thermal energy source disposed internally within the host and comprising a radioisotope material.

12. A superemissive light pipe system comprising one or more light pipe systems each comprising a number of superemissive light pipes as recited in claim 1, wherein end portions of the light pipes in each system are collected together and are directed to one or more photovoltaic cells.

13. A superemissive light pipe for generating photons, comprising:

an elongated photon transmitting host; an optical cladding disposed adjacent an outside surface of the host, wherein photons transmitted by the host are reflected by the cladding into the host and are directed toward end portions of the host; and a layer of superemissive material for emitting photons interposed between said outside surface of the host and the optical cladding.

14. The superemissive light pipe as recited in claim 13 comprising means for thermally stimulating the superemissive material positioned external from the host to effect the emission of photons.

15. The superemissive light pipe as recited in claim 13 wherein the superemissive material is selected from the group of rare earth elements consisting of neodymium, yttrium, ytterbium, holmium, erbium, thulium, cerium, thorium, thorium-holmium, aluminum-ytterbium-yttrium mixed oxides, and mixtures thereof.

16. The superemissive light pipe as recited in claim 13 wherein the optical cladding is formed from a material having an index of refraction different from that of the transparent host.

17. The superemissive light pipe as recited in claim 13 comprising at least one photovoltaic cell positioned adjacent an end portion of the host for receiving photons and for converting photon radiation to electricity.

18. The superemissive light pipe as recited in claim 17 comprising an optical filter interposed between the end portion of the host and the photovoltaic cell to ensure that photons received by the photovoltaic cell are within a predetermined wavelength.

19. The superemissive light pipe as recited in claim 17 comprising an optical reflector positioned at an end portion of the host opposite from the photovoltaic cell to reflect photons through the host and toward the photovoltaic cell.

20. A superemissive light pipe for generating photons, comprising:

an elongated photon transmitting host formed from a transparent material, wherein the host comprises a cylindrical body having end portions at opposite body ends;

an optical cladding disposed around an outside surface of the host body for reflecting photons, and wherein the optical cladding has an index of refraction that is different from that of the host;

a superemissive material disposed within the host for emitting photons upon thermal stimulation; and means for thermally stimulating the superemissive material to emit photons, wherein the photons are emitted from at least one end portion of the host.

21. The superemissive light pipe as recited in claim 20 wherein the superemissive material is selected from the group of rare earth elements consisting of neodymium, yttrium, ytterbium, holmium, erbium, thulium, cerium, thorium, thorium-holmium, aluminum-ytterbium-yttrium mixed oxides, and mixtures thereof.

22. The superemissive light pipe as recited in claim 20 wherein the host material is formed from optically transparent materials selected from the group consisting of crystal, ceramics, and glass.

23. The superemissive light pipe as recited in claim 20 wherein the means for thermally stimulating the superemissive material is a thermal energy source disposed internally within the host and comprising a radioisotope material.

24. A superemissive light pipe for generating photons comprising:

an elongated photon transmitting host formed from an optically transparent material, wherein the host comprises a cylindrical body with end portions at opposite body ends;

a superemissive material disposed onto a surface of the host for emitting photons upon thermal stimulation;

an optical cladding for reflecting photons emitted from the superemissive material, wherein the optical cladding is disposed on a surface of the superemissive material, and wherein the optical cladding has an index of refraction that is different from that of the host; and means for thermally stimulating the superemissive material to emit photons, wherein the photons are emitted from at least one end portion of the host.

25. The superemissive light pipe as recited in claim 24 wherein the superemissive material is selected from the group or rare earth elements consisting of neodymium, yttrium, ytterbium, holmium, erbium, thulium, cerium, thorium, thorium-holmium, aluminum-ytterbium-yttrium mixed oxides, and mixtures thereof.

26. The superemissive light pipe as recited in claim 24 wherein the host is selected from the group of optically transparent materials consisting of crystal, ceramics, and glass.

27. The superemissive light pipe as recited in claim 24 wherein the means for thermally stimulating the superemissive material comprises a thermal energy source positioned externally outside of the host.

28. The superemissive light pipe as recited in claim 27 wherein the external thermal energy source is selected from the group consisting of a fuel combustion system, a nuclear reactor, a solar collector, and the exhaust of a jet engine.

29. The superemissive light pipe as recited in claim 24 wherein the means for thermally energizing the superemissive material is a thermal energy source disposed internally within the host and comprising a radioisotope material.

* * * * *